US006417532B2

(12) United States Patent
Tsunoda et al.

(10) Patent No.: US 6,417,532 B2
(45) Date of Patent: Jul. 9, 2002

(54) POWER SEMICONDUCTOR MODULE FOR USE IN POWER CONVERSION UNITS WITH DOWNSIZING REQUIREMENTS

(75) Inventors: Tetsujiro Tsunoda, Urawa; Satoshi Nakao, Ibo-gun; Kaoru Imamura, Kawasaki; Shinichi Umekawa, Sagamihara, all of (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/769,398

(22) Filed: Jan. 26, 2001

(30) Foreign Application Priority Data

Jan. 28, 2000 (JP) ........................................ 2000-020293

(51) Int. Cl.⁷ ........................................... H01L 27/148
(52) U.S. Cl. ........................................ 257/219; 257/723
(58) Field of Search ................................ 257/219, 723, 257/703, 698, 712, 690, 718; 361/760; 326/761

(56) References Cited

U.S. PATENT DOCUMENTS 5,347,160 A * 9/1994 Sutrina ........................ 257/698
5,521,437 A * 5/1996 Oshima et al. .............. 257/701
5,616,955 A * 4/1997 Yamada et al. .............. 257/690
5,621,243 A * 4/1997 Baba et al. .................. 257/712
5,900,738 A * 5/1999 Khandros et al. ........... 324/761
5,920,119 A * 7/1999 Tamba et al. ................ 257/718
5,942,797 A * 8/1999 Teresawa ..................... 257/723
6,060,772 A   5/2000 Sugawara et al.
6,239,980 B1 * 5/2001 Fillion et al. ................ 361/760
6,297,549 B1 * 10/2001 Hiyoshi ....................... 257/703

* cited by examiner

Primary Examiner—Hoai V. Ho
Assistant Examiner—Thinh Nguyen
(74) Attorney, Agent, or Firm—Oblon, Spivak, McClelland, Maier & Neustadt, P.C.

(57) ABSTRACT

A power semiconductor module comprises a circuit board made of an insulating substrate of good thermal conductivity formed with interconnect patterns, a plurality of power semiconductor chips mounted on the circuit board, bonding wires for electrically connecting the semiconductor chips and the interconnect patterns, outer lead terminals fixed to the interconnect patterns, and a resin layer for covering at least the chip mounted surface of the circuit board in its entirety so that the tip of each of the outer lead terminals is exposed.

38 Claims, 10 Drawing Sheets

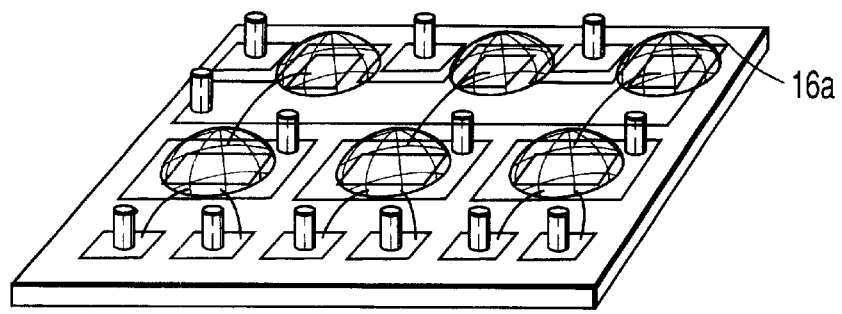
F I G. 4A
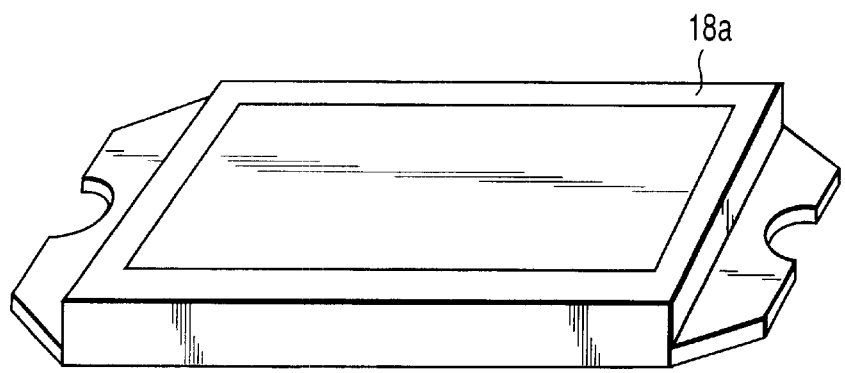
F I G. 4B
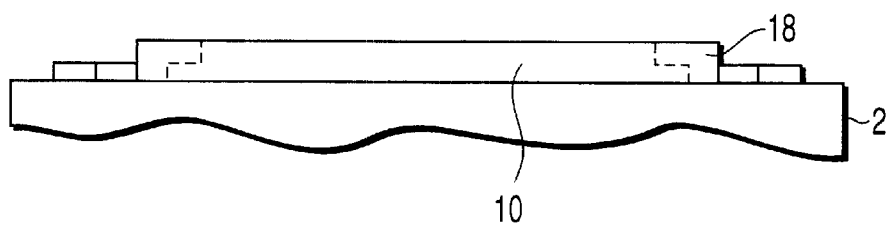
F I G. 4C

POWER SEMICONDUCTOR MODULE FOR USE IN POWER CONVERSION UNITS WITH DOWNSIZING REQUIREMENTS

CROSS-REFERENCE TO RELATED APPLICATIONS

This application is based upon and claims the benefit of priority from the prior Japanese Patent Application No. 2000-020293, filed Jan. 28, 2000, the entire contents of which are incorporated herein by reference.

BACKGROUND OF THE INVENTION

The present invention relates to a power semiconductor module and more specifically to a package structure for a power semiconductor module for use in power conversion units, such as inverters, converters, etc., which require downsizing.

Power semiconductor modules in which power semiconductor devices, such as IGBTs, MOSFETs, bipolar transistors, etc., are mounted on the same circuit board are used in motor drive circuits by way of example.

FIG. 14 is an equivalent circuit diagram of a three-phase motor driving inverter using a power semiconductor module.

In this figure, 81 denotes power IGBT devices (chips), 82 a power supply terminal, 83 ground terminals, 84 input terminals, and 85 output terminals.

FIG. 15 is a schematic exterior view of a conventional power semiconductor module, FIG. 16 is a plan view of the module of FIG. 15. The module has a structure such that a plurality of power semiconductor devices (chips) 91 are mounted on a circuit board 92 and electrically connected by means of bonding wires to connectors in a case 94 to which pins 95 as module outer leads are attached.

In such a structure, the pins 95 are attached to the case 94. This requires interconnect lines and bonding wires to be laid on the circuit board 92 to connect the semiconductor chips 91 and the pins 95, which imposes restrictions on downsizing of the module.

Laying wirings on the circuit board 92 results in increased electrical resistance and inductance. Moreover, even if a request is made by an individual user for changing the circuit pattern on the circuit board 92 or the location of the pins 95, it cannot be filled with ease because a significant design change is required.

Thus, the conventional power semiconductor module is subject to restrictions on downsizing due to the outer lead terminals 95 being attached to the case and suffers an increase in the electrical resistance and inductance due to the wirings.

BRIEF SUMMARY OF THE INVENTION

It is an object of the present invention to provide a power semiconductor module which can be reduced in size, can decrease the cost and the electrical resistance and inductance of wirings by reduction in size, and can flexibly fulfill individual user's requirements to change the circuit pattern on a circuit board and the location of outer lead terminals.

According to an aspect of the present invention, there is provided a power semiconductor module comprising: a circuit board having an insulating substrate and first and second interconnect patterns formed on the insulating substrate; a power semiconductor chip mounted on the first interconnect pattern; bonding wire for electrically connecting the semiconductor chip and the second interconnect pattern; outer lead terminals fixed to each of the first and second interconnect patterns; and a resin layer for covering at least the chip mounted surface of the circuit board in its entirety so that the tip of each of the outer lead terminals is exposed.

According to another aspect of the present invention, there is provided a power semiconductor module comprising: a circuit board having an insulating substrate and first and second interconnect patterns formed on the insulating substrate; a power semiconductor chip mounted on the first interconnect pattern; bonding wire for electrically connecting the semiconductor chip and the second interconnect pattern; outer lead terminals fixed to the first and second interconnect patterns; and a resin layer for covering at least each of the semiconductor chips mounted on the circuit board so that the tip of each of the outer lead terminals is exposed.

The present invention allows wirings between the semiconductor chips and the outer lead terminals to be shortened, reducing the electrical resistance and inductance of the wirings. The dimensions of the semiconductor module can be scaled down, reducing the cost. Individual user's requirements to change the circuit pattern on the circuit board and the location of the outer lead terminals can be fulfilled with flexibility.

In addition, when the insulation design for voltages for use with the semiconductor module permits, the resin layer is allowed to cover the chips only, which can lessen the effects of warp of the circuit board due to contraction of the resin layer.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIGS. 4A and 4B are schematic perspective views of a power semiconductor module according to a fourth embodiment of the present invention;

FIG. 4C is a side view of the module according to the fourth embodiment;

DETAILED DESCRIPTION OF THE INVENTION

Referring now to drawings there is shown a power semiconductor module according to embodiments of the present invention.

First Embodiment

Figure 1A:
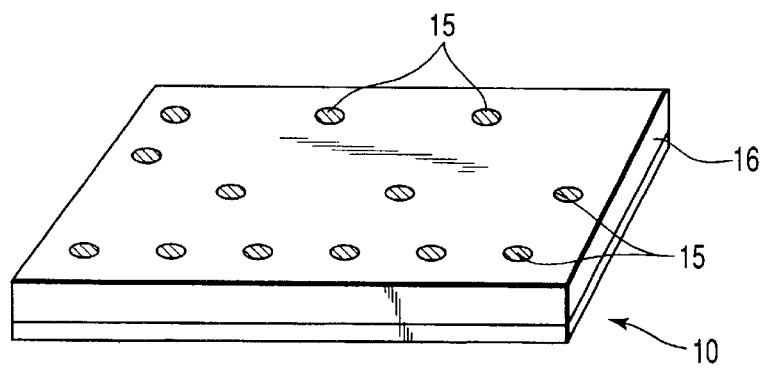
FIG. 1A is a schematic perspective view of a power semiconductor module according to a first embodiment of the present invention.
Figure 1B:
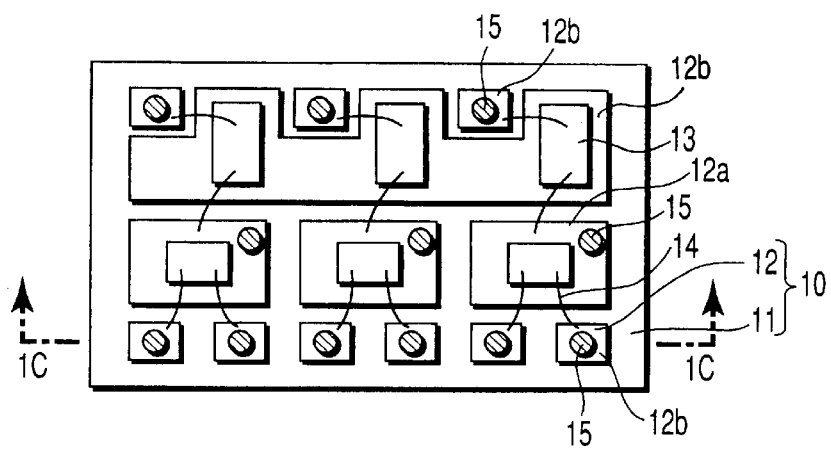
FIG. 1B is a schematic plan view of the circuit board of the module of FIG. 1A on which semiconductor chips are mounted.
Figure 1C:
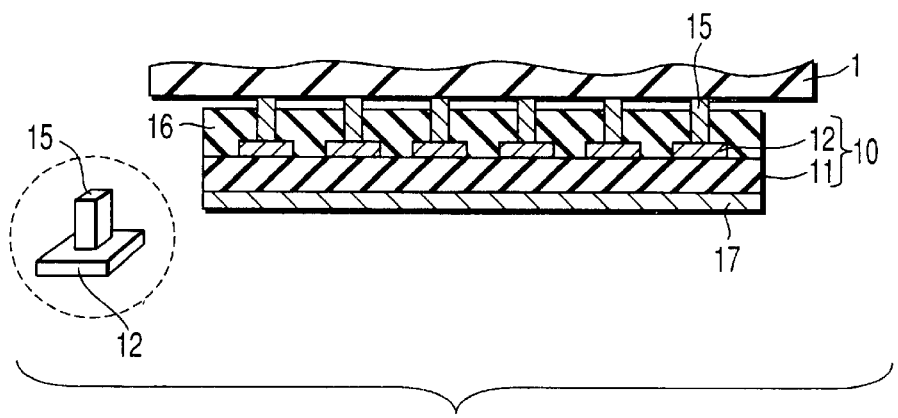
FIG. 1C is a sectional view taken along line 1C—1C of FIG. 1B.

FIG. 1A is a schematic perspective view of the power semiconductor module, FIG. 1B is a schematic plan view of the circuit board of the module of FIG. 1A on which semiconductor chips are mounted, and FIG. 1C is a schematic sectional view of the semiconductor module of FIG. 1A taken along line 1C—1C of FIG. 1B.

Figure 15:
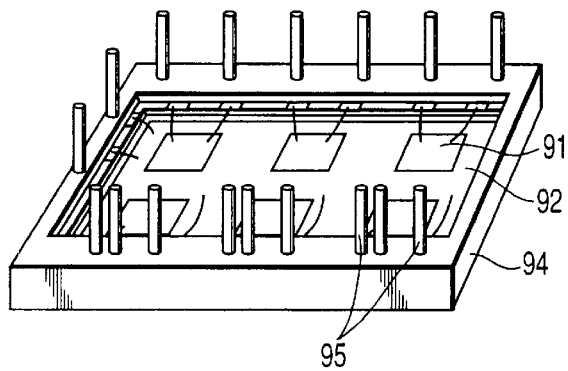
FIG. 15 is a schematic perspective view of a conventional power semiconductor module.
Figure 16:
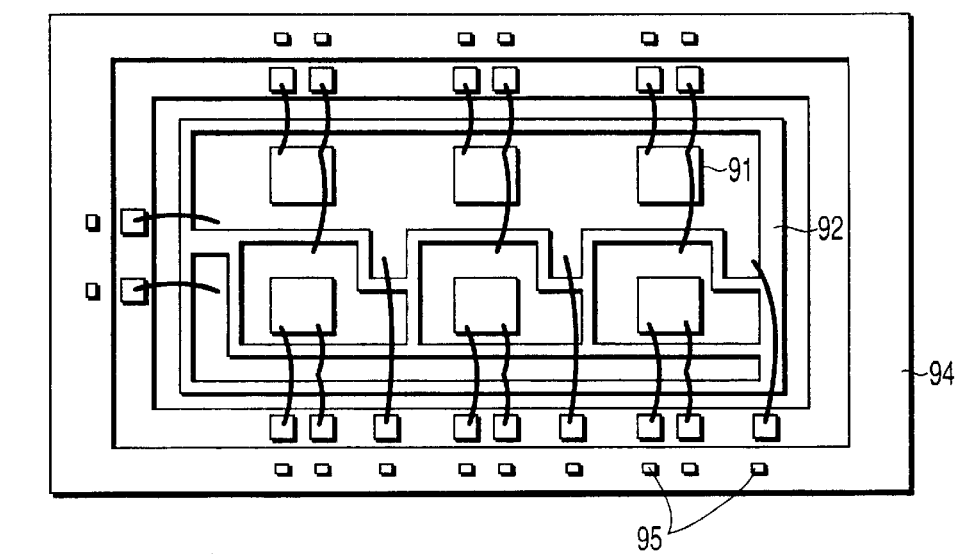
FIG. 16 is a plan view of the module of FIG. 15.

The power semiconductor module is supposed to form such a three-phase motor driving inverter as shown in FIG. 15.

In the power semiconductor module shown in FIGS. 1A to 1C, 10 denotes a circuit board having an insulating substrate 11 of good thermal conductivity, 100–200 W/mK, for example, and interconnect patterns 12 (12a, 12b) made of copper formed on the insulating substrate. A plurality of power semiconductor chips 13 is mounted on the circuit board 10. The semiconductor chips are provided with electric power at their back side. Electrodes of the semiconductor chips 13 and the interconnect patterns 12 are electrically connected by means of bonding wires 14. Outer lead terminals 15 are fixed to the respective individual interconnect patterns 12. At least the chip mounted surface of the circuit board 10 is covered in its entirety with a resin layer 16. The top part of each of the outer lead terminals 15 and the opposite surface of the circuit board 10 to its chip mounted surface are exposed.

The insulating substrate 11 may be made of any one of insulating materials including ceramics. Among them, SiN ceramic is easy to use because it is excellent in strength. In this embodiment, the interconnect patterns 12 consisting of copper sheet are formed on the insulating substrate 11 made of SiN ceramic. A copper plate 17 having good radiation property is formed on the opposite surface of the insulating substrate to its chip mounted surface.

As the outer lead terminals 15 use is made of pads in the form of cylinder or square pillar. This allows electrical connection between the outer lead terminals 15 and an external circuit 1, a power supply circuit, motors, for example, to be made through soldering, pressure contact, wire bonding, or welding. In this embodiment, cylindrical pads are used which are substantially equal to one another in height and diameter. A pad in the form of square pillar is illustrated within broken circle in FIG. 1C.

Each pad can be fixed to any place on the interconnect pattern 12 on the circuit board 10, allowing a required circuit to be arranged with flexibility. However, it is desired that each pad as the outer lead terminals be fixed to such a place as to minimize wiring over the circuit board.

The resin layer 16 comprises an epoxy resin of low stress or a silicone resin (Si gel or the like) of low stress.

The above arrangement allows wirings between the chips 13 and the outer lead terminals 15 to be shortened. Thus, the module can be scaled down, the cost can be reduced, and the resistance and inductance of the wirings can be reduced.

In addition, individual user's requirements to change the circuit pattern 12 on the circuit board 10 and the location of the outer lead terminals 15 can be fulfilled by merely changing the location of the outer lead terminals.

The pads in the form of cylinder or square pillar are used as the outer lead terminals. For connection between the chips 13 and the external circuit 1, therefore, the pads 15 are simply connected to the external circuit 1 through soldering, pressure contact, wire bonding, or welding, providing a semiconductor module easy to handle.

The semiconductor module can be shaped into a thin, flat form including terminals. As a semiconductor module in the form of a card, therefore, the module can be put into a slot for use.

Second Embodiment

Figure 2A:
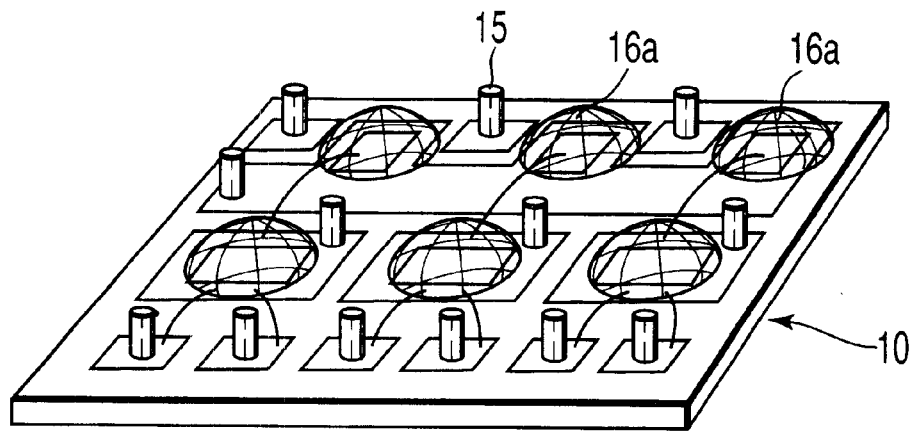
FIG. 2A is a schematic perspective view of a power semiconductor module according to a second embodiment of the present invention.
Figure 2B:
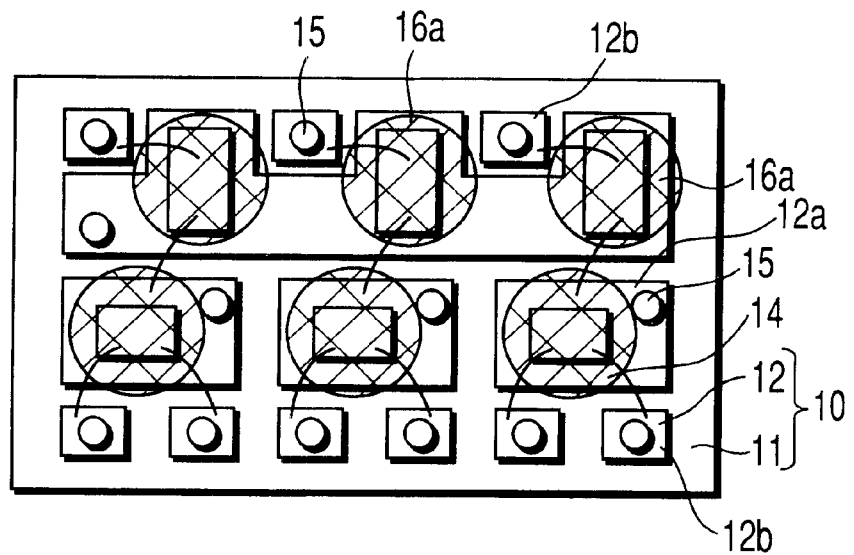
FIG. 2B is a plan view of the module of FIG. 2A.

FIG. 2A is a schematic perspective view of a power semiconductor module according to a second embodiment of the present invention, and FIG. 2B is a plan view of the module of FIG. 2A.

The power semiconductor module of the second embodiment differs from that of the first embodiment described in conjunction with FIGS. 1A to 1C in that the resin layer 16a is formed to cover each individual one of the chips 13 rather than covering the chip mounted surface of the substrate in its entirety. In the other respects, the second embodiment remains unchanged from the first embodiment and, in FIGS. 2A and 2B, therefore, like reference numerals are used to denote corresponding parts to those in FIGS. 1A to 1C.

The semiconductor module of the second embodiment provides basically the same advantages as that of the first embodiment. An additional advantage is provided in the case of the second embodiment in that the circuit board 10 is little warped even if the resin layer 16a contracts because only the chips mounted on the circuit board are covered with the resin. It does not matter if the insulating strength is lowered because of a reduction in the resin covered area as long as the insulation design for the voltages used in the semiconductor module permits.

Third Embodiment

Figure 3A:
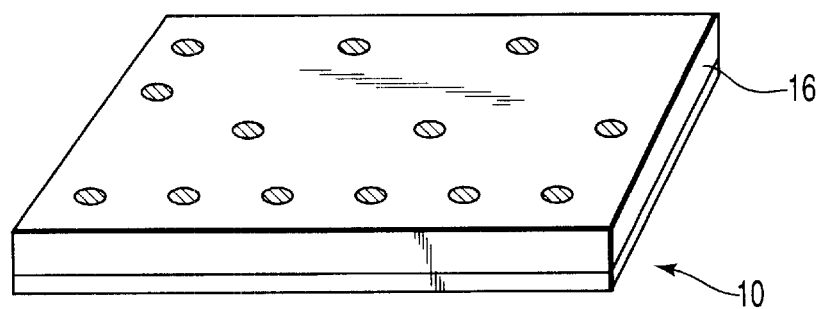
FIGS. 3A and 3B are schematic perspective views of a power semiconductor module according to a third embodiment of the present invention.
Figure 3B:
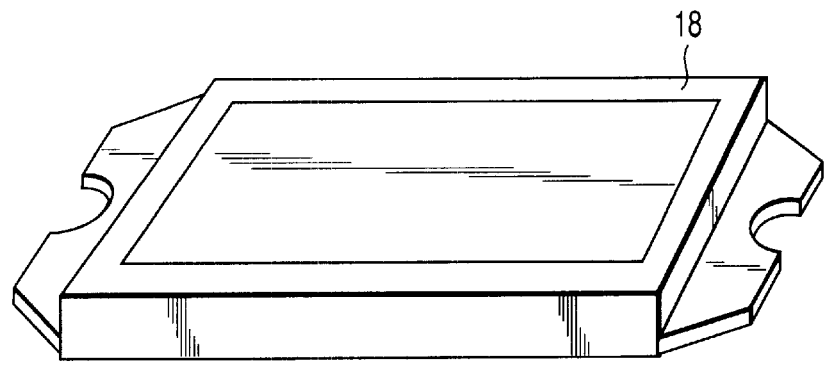
Figure 3C:
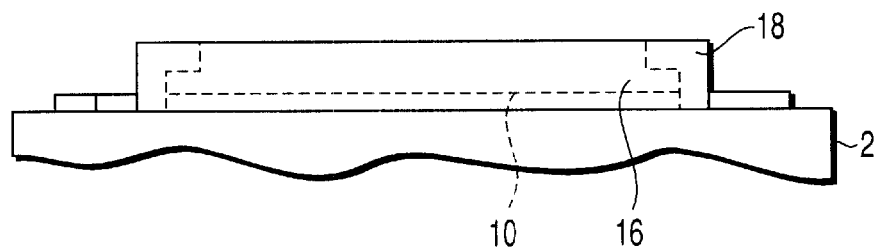
FIG. 3C is a side view of the module according to the third embodiment.

FIGS. 3A to 3C show a power semiconductor module according to a third embodiment of the present invention.

The power semiconductor module of the third embodiment differs from that of the first embodiment described in conjunction with FIGS. 1A to 1C in that an insulating case 18 is provided which covers at least the edges of the top surface and sides of the resin layer 16 and can attach (clamp) the opposite surface of the circuit board 10 to the chip mounted surface to a radiation plate 2. In the other respects, the third embodiment remains unchanged from the first embodiment and therefore like reference numerals are used to denote corresponding parts to those in FIGS. 1A to 1C. As the insulating case, a low cost one is used.

The semiconductor module of the third embodiment provides basically the same advantages as that of the first embodiment. In addition, it is possible to press the circuit board 10 against the radiation plate by screw-clamping the insulating case 18 to the radiation plate. Therefore, a semiconductor module having good radiation property can be implemented.

Fourth Embodiment

FIGS. 4A to 4C show a power semiconductor module according to a fourth embodiment of the present invention.

The power semiconductor module of the fourth embodiment differs from that of the second embodiment described in conjunction with FIGS. 2A and 2B in that an insulating case 18a made of, say, a resin is provided which covers at least the edges of the top surface and sides of the circuit board 10 and can attach (clamp) the opposite surface of the circuit board 10 to the chip mounted surface to a radiation plate 2. In the other respects, the fourth embodiment remains unchanged from the second embodiment and therefore like reference numerals are used to denote corresponding parts to those in FIGS. 2A and 2B.

The semiconductor module of the fourth embodiment provides basically the same advantages as that of the second embodiment. In addition, it is possible to press the circuit board 10 against the radiation plate by screw-clamping the insulating case 18a to the radiation plate. Therefore, a semiconductor module having good radiation property can be implemented.

The insulating case 18a and the circuit board 10 may be glued together. In this case, it is possible to fill an epoxy or silicone resin of low stress into the insulating case 18a. With the use of these resins, the resin layer 16a covering each individual semiconductor chip would become unnecessary.

Fifth Embodiment

In the semiconductor modules of the first through fourth embodiments, the circuit board 10 can warp because of contraction of the resin layer 16 or 16a.

Figure 5A:
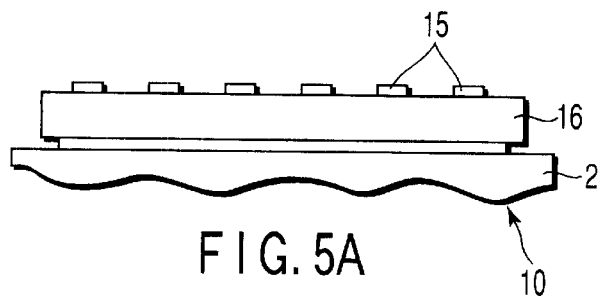
FIG. 5A is a schematic side view illustrating the state where the circuit board warped by contraction of a resin layer is pressed against a radiating plate in a power semiconductor module according to a fifth embodiment of the present invention.

FIG. 5A is a schematic side view illustrating the state in which, in a power semiconductor module of a fifth embodiment of the present invention, the circuit board 10 which has warped because of contraction of the resin layer is attached to the radiation plate 2 under pressure.

As shown in FIG. 5A, when the circuit board 10 has slightly warped (in the range of 0 to 100 μm) because of contraction of the resin layer 16 and the user mounts the warped circuit board on the radiation plate 2 (particularly when the circuit board is clamped by the insulating case 18 as in the third and fourth embodiments), good thermal contact resistance is obtained between the circuit board and the radiation plate. In this case, since a stress due to clamping is produced in the circuit board 10, the SiN ceramic having high fracture toughness and transverse strength is suitably used as a material of the insulating substrate 11.

Figure 5B:
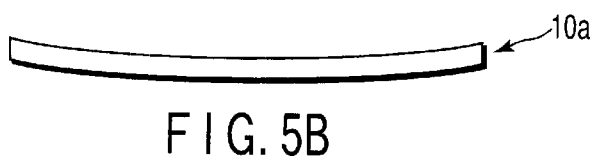
FIGS. 5B and 5C are schematic side views of a circuit board having being previously warped in a direction to cancel out the warp of the circuit board of FIG. 5A.
Figure 5C:
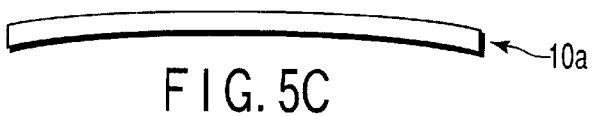

FIGS. 5B and 5C show circuit boards 10a which have been warped previously in a direction to cancel out the warp of the circuit board 10 of FIG. 5A caused by contraction of the resin layer.

By forming interconnect patterns using an insulating substrate having its both sides covered with metal sheets each with a different thickness, the circuit board 10a can be warped in advance. The direction and amount of warp vary according to the thermal expansion coefficient of each of the circuit board and the resin layer and the curing temperature of the resin layer. The amount of the advance warp is selected such that the amount of the warp of the finished semiconductor module is in the range of 0 to 100 μm.

Sixth Embodiment

Figure 6A:
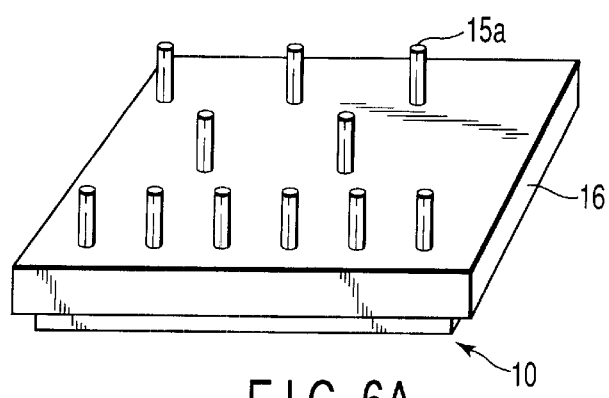
FIG. 6A is a schematic perspective view of a power semiconductor module according to a sixth embodiment of the present invention.
Figure 6B:
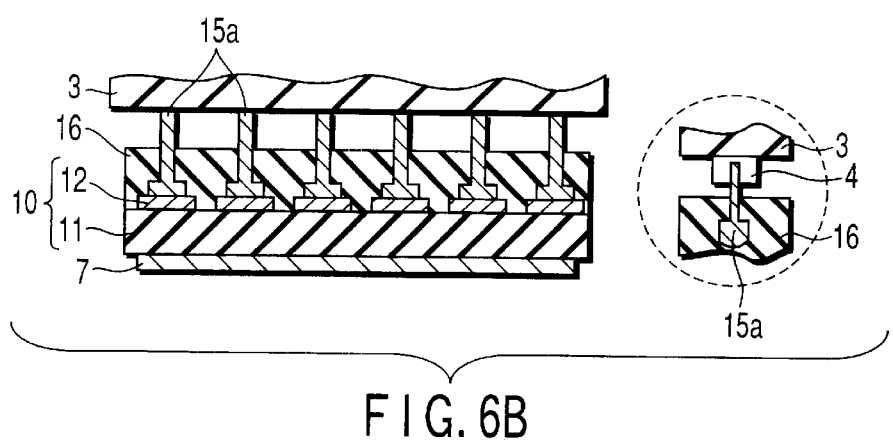
FIG. 6B is a schematic sectional view of the module of FIG. 6A.

FIGS. 6A and 6B show a power semiconductor module according to a sixth embodiment of the present invention.

The power semiconductor module of the sixth embodiment differs from those described in conjunction with FIGS. 1A to 5C in that pins 15a are used as outer lead terminals.

The semiconductor module of the sixth embodiment provides basically the same advantages as those of the first to fifth embodiments. The connection of the pins 15a with the external circuit can be made by means of soldered connection to a printed circuit board 3, connection to connectors 4 on the printed circuit board 3 as shown in broken circle in FIG. 6B, or connector connection.

Seventh Embodiment

A seventh embodiment is directed to a structure that enables a part, such as an air cooling fan, to be attached to the opposite surface of the circuit board to the chip mounted surface in the power semiconductor modules described so far.

FIGS. 7A to 7D show power semiconductor modules according to the seventh embodiment of the present invention.

Figure 7A:
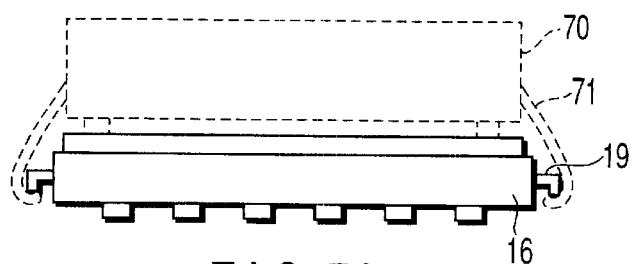
FIGS. 7A, 7B, 7C and 7D are schematic side views of semiconductor modules according to a seventh embodiment of the present invention in which a resin layer is provided on its sides with locks capable of clamping fan mounting claws.

In the semiconductor module of FIG. 7A, the resin layer 16 is provided on its sides with projecting locks 19 capable of anchoring claws 71 for fixing a fan 70.

Figure 7B:
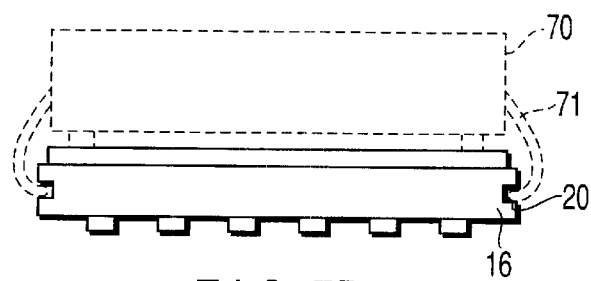

In the semiconductor module of FIG. 7B, the resin layer 16 is provided on its sides with recessed locks 20 capable of anchoring the claws 71 for fixing the fan 70.

Figure 7C:
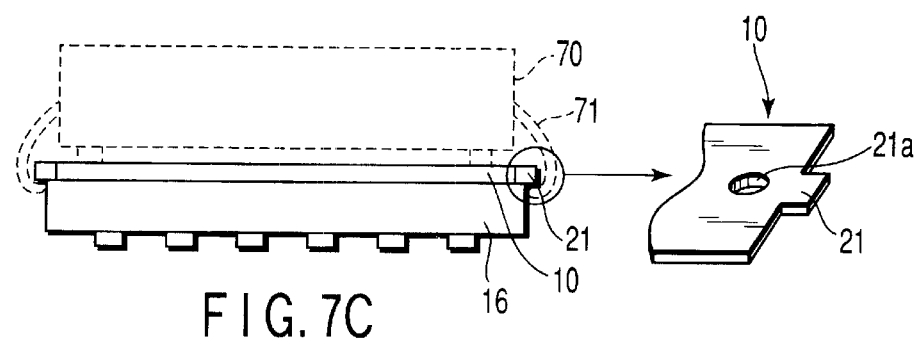

In the semiconductor module of FIG. 7C, the circuit board 10 is provided on its sides with projecting locks 21 capable of anchoring the claws 71 for fixing the fan 70.

Figure 7D:
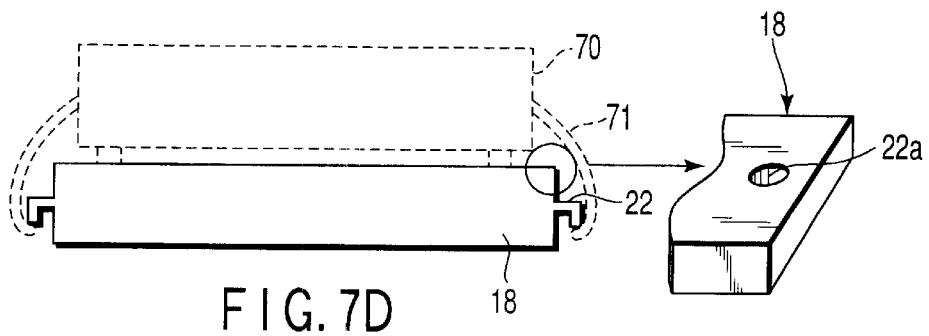

In the semiconductor module of FIG. 7D, the insulating case 18 is provided on its sides with projecting locks 22 capable of anchoring the claws 71 for fixing the fan 70.

Instead of providing the locks 19, 20 for anchoring the fan mounting claws 71, for example, the insulating case 18 may be formed with structures 21a, 22a for screwing mounting brackets (not shown) of the fan 70.

According to the semiconductor module thus constructed, basically the same advantages as the semiconductor modules of the first to sixth embodiments are obtained. In addition, the fan 70 can be attached to the opposite surface of the circuit board 10 to the chip mounted surface; thus, the semiconductor module can be air cooled with no need of the radiation plate.

Eighth Embodiment

Figure 8A:
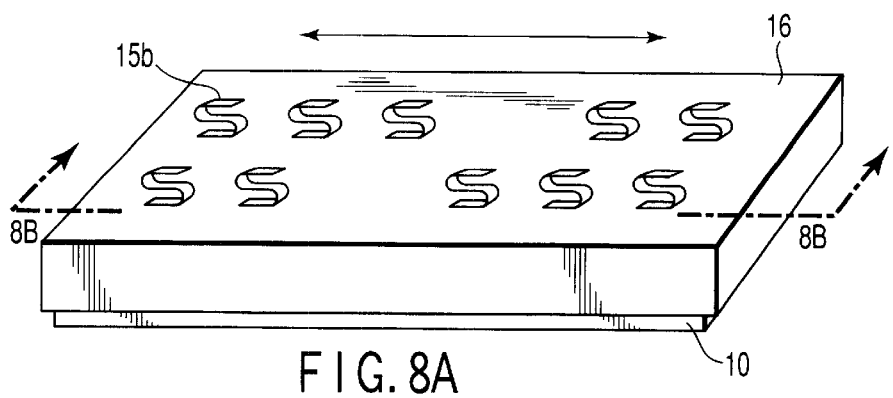
FIG. 8A is a schematic perspective view of a power semiconductor module according to an eighth embodiment of the present invention.

FIG. 8A is a perspective view of a power semiconductor module according to an eighth embodiment of the present invention. As shown in FIG. 8A, the semiconductor module is constructed such that elastic stress relaxing portions of outer lead terminals 15b are protruded from the top of the resin layer 16.

Figure 8B:
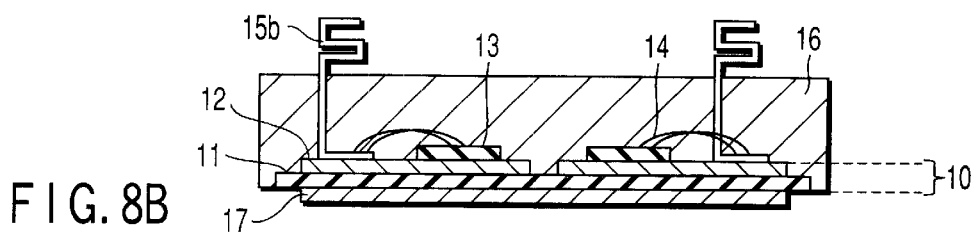
FIG. 8B is a schematic sectional view taken along line 8B—8B of FIG. 8A.

FIG. 8B is a schematic sectional view illustrating the structure along line 8B—8B of FIG. 8A. In these figures, 10 denotes a circuit board comprising an insulating substrate 11 of good thermal conductivity which is formed on top with interconnect patterns 12. A plurality of power semiconductor chips 13 is mounted on the circuit board 10. The semiconductor chips 13 and the interconnect patterns 12 are electrically connected by means of bonding wires 14. Outer lead terminals 15b are connected to the respective individual interconnect patterns 12. At least the entire surface of the circuit board 10 on which the semiconductor chips are mounted is covered with a resin layer 16. The tip (stress relaxing portion) of each outer lead terminal 15b is exposed from the top of the resin layer 16 and the opposite surface of the circuit board to the chip mounted surface is exposed.

Figure 9A:
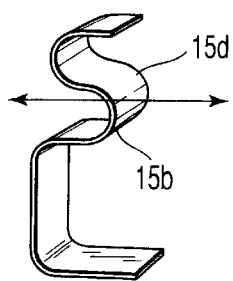
FIGS. 9A, 9B, 9C and 9D are exterior views of the outer lead terminals in the eighth embodiment of the invention.
Figure 9B:
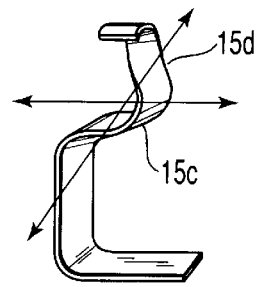

FIGS. 9A and 9B show, in exterior view, examples of the outer lead terminals of the present embodiment. As shown in FIG. 9A, the outer lead terminal is formed by bending a metal sheet having an appropriate width. The outer lead terminal is bent in its lower portion into the shape of the letter L and formed in the upper portion into a stress relaxing portion 15d in the shape of the letter S. The stress relaxing portion can relax stress in the direction of an arrow shown.

Figure 9C:
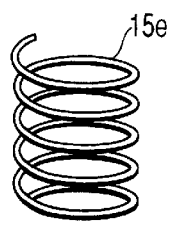
Figure 9D:
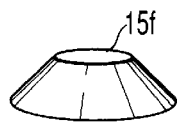

FIG. 9B shows another example of the outer lead terminal 15b. In this example, the S-shaped upper portion of the outer lead terminal shown in FIG. 9A is twisted by 90 degrees relative to the lower portion. In this structure, the stress in directions perpendicular to each other can be relaxed. Further, the outer lead terminal itself may be formed into a coiled spring 15C as shown in FIG. 9C. Moreover, the outer lead terminal may be provided on top with a disc spring 15f as shown in FIG. 9D.

In fixing the outer lead terminal 15b to the interconnect pattern 12, the bottom of its lower portion in the shape of the letter L is joined to the pattern by means of either soldering, brazing, or welding. The upper portion in the shape of the letter S is set to protrude from the resin layer 16.

The amount of warp of the semiconductor module due to thermal variations increases along the longitudinal line of the module indicated by arrows shown in FIG. 8A. Thus, the outer lead terminal 15b is placed so that the direction in which the semiconductor module warps greatly and the direction indicated by arrows in FIG. 9A are parallel to each other. The outer lead terminal 15c of FIG. 9B is also placed so that one of the directions perpendicular to each other is parallel to the direction in which the semiconductor module warps greatly.

Figure 10:
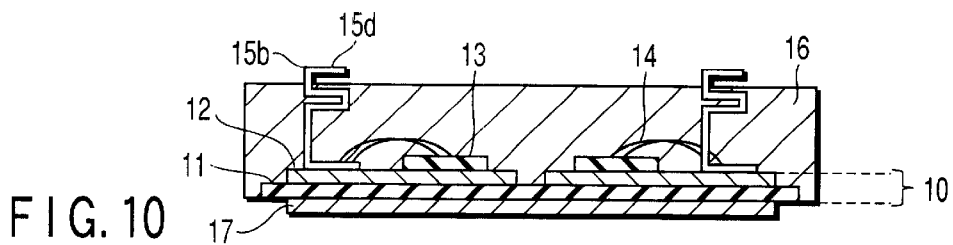
FIG. 10 is another schematic sectional view according to the eight embodiment.

When a hard resin, for example, an epoxy resin, is used for the resin layer 16, it is required to place the stress relaxing portion 15d of each outer lead terminal 15b outside the resin layer as shown in FIG. 8B. However, when the resin layer 16 is made of a soft resin, for example, a silicon-based material, a part of the stress relaxing portion 15d may be placed inside the resin layer 16 as shown in FIG. 10. In FIG. 10, like reference numerals are used to denote corresponding parts to those in FIG. 8B and descriptions thereof are omitted.

As described above, the outer lead terminal 15b is formed by bending sheet metal. For this reason, the area of contact between the outer lead terminal and the interconnect pattern and between the outer lead terminal and a pressure-contact land on a printed circuit board can be increased; thus, high current can be handled with ease.

Conventionally, a structure has been developed in which an outer lead terminal in line form is pressure-contacted to an interconnect pattern to make point contact between them. In comparison with this structure, the eighth embodiment provides stable contact between the outer lead terminal 15b and the interconnect pattern 12, increasing the reliability of the power semiconductor module.

In the case of the module shown in FIG. 10, part of the stress relaxing portion 15d of the outer lead terminal 15b is buried in the resin layer 16; thus, the overall height of the module can be decreased in comparison with the module shown in FIG. 8B, allowing the module size to be further reduced.

Next, examples of ways to mount the semiconductor module will be described. Although the following description is given in terms of the semiconductor module shown in FIG. 8B, the semiconductor module shown in FIG. 10 may also be used.

Figure 11A:
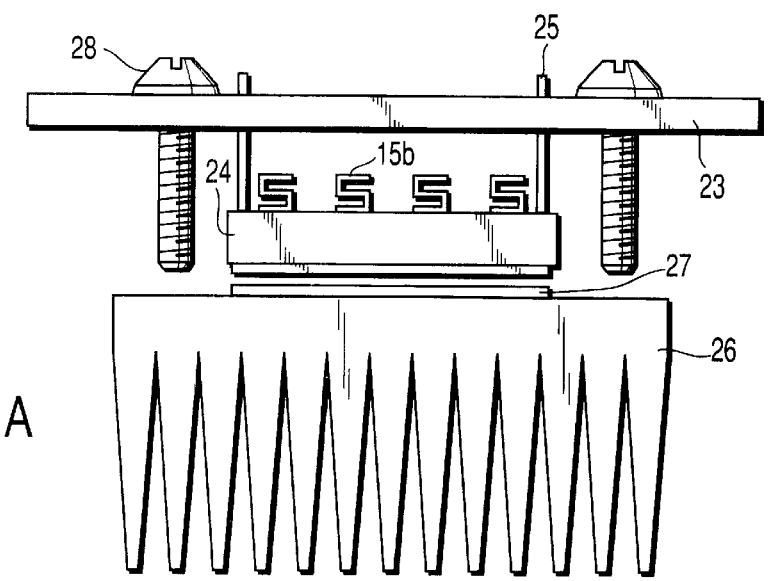
FIGS. 11A and 11B show a first example of mounting the power semiconductor module according to the eighth embodiment of the present invention.
Figure 11B:
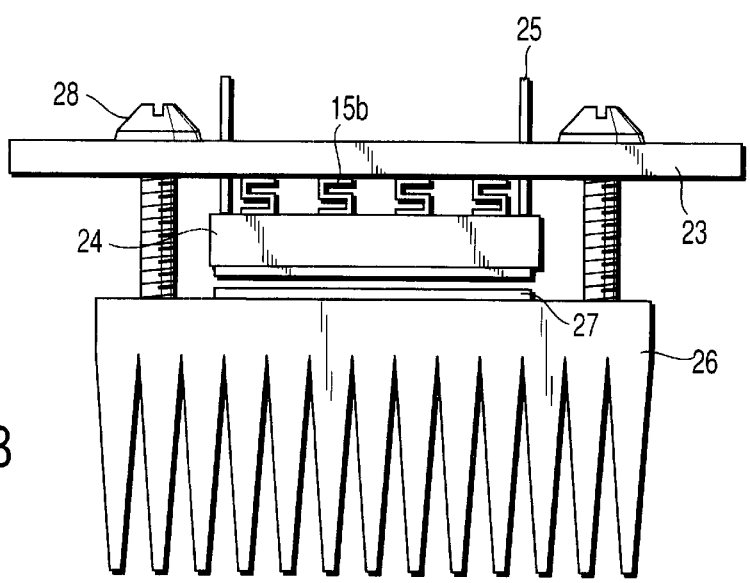

FIGS. 11A and 11B show a first example. In these figures, 23 denotes a printed circuit board on which the semiconductor module 24 is mounted. Though not shown, the printed circuit board 23 is provided with pressure-contact lands to which the outer lead terminals 15b of the semiconductor module 24 are electrically connected. The semiconductor module 24 is provided on top with alignment guides 25 by which each of the outer lead terminals 15b is accurately aligned with a corresponding one of the pressure contact lands. A suitable number of alignment guides, not less than two, is provided. The reference numeral 26 is a radiating fin which is brought into contact with the module 24 with grease 27. The fin 26 is fixed to the printed circuit board 23 with screws 28.

In mounting, the guides 25 are inserted into guide holes (not shown) in the printed circuit board 23 as shown in FIG. 1A so that the outer lead terminals 15b of the semiconductor module 24 are accurately aligned with the pressure contact lands of the circuit board 23.

In this state, as shown in FIG. 11B, screws 28, provided in as many as six places in the printed circuit board 23, are turned into the radiating fin 26 so that the fin is secured to the semiconductor module 24. As a result, the outer lead terminals 15b are brought into pressure contact with the pressure contact lands.

In the above example, the semiconductor module 24 and the radiating fin 26 are placed under the printed circuit board 23. Conversely, the semiconductor module and the radiating fin may be placed over the printed circuit board.

According to the first example, the semiconductor module 24 and the radiating fin 26 can be attached to the printed circuit board 23 with the screws 28 only, allowing the mounting work to be simplified.

Figure 12:
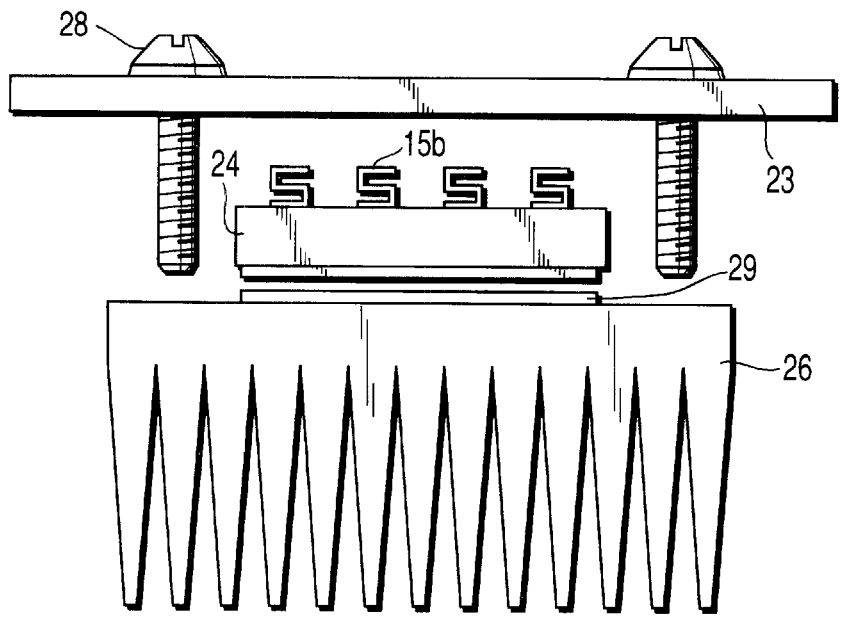
FIG. 12 shows a second example of mounting the power semiconductor module according to the eighth embodiment of the present invention.

A second example will be described next with reference to FIG. 12, in which like reference numerals are used to denote corresponding parts to those in FIGS. 11A and 11B.

In the second example, the module 24 and the radiating fin 26 are first joined together with solder 29. In this manner, the radiating fin is attached in advance to the semiconductor module. After that, using jigs not shown, the outer lead terminals 15b are aligned with the pressure contact lands of the printed circuit board. In this state, the screws 28 inserted into the printed circuit board 23 are turned into the radiating fin 26, thereby securing the semiconductor module to the printed circuit board. In this manner, the module 24 and the radiating fin 26 are secured to the printed circuit board 23, so that the outer lead terminals 15b are brought into pressure contact with the pressure contact lands.

Figure 13:
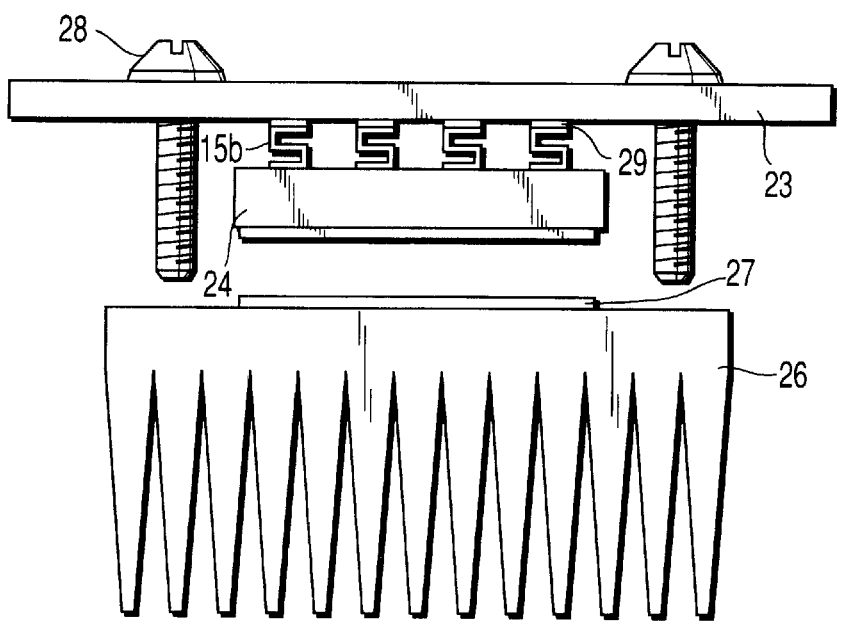
FIG. 13 shows a third example of mounting the power semiconductor module according to the eighth embodiment of the present invention.
Figure 14:
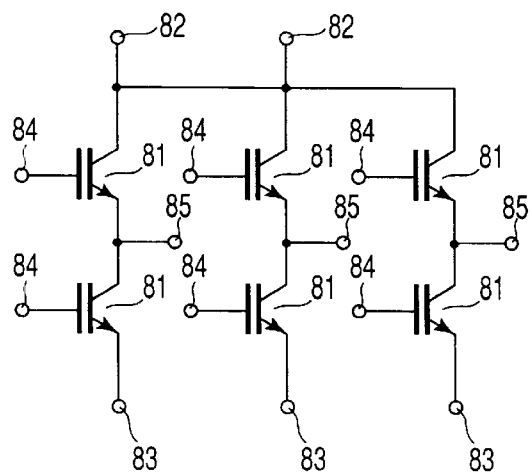
FIG. 14 is an equivalent circuit diagram of a three-phase motor driving inverter using a power semiconductor module.

FIG. 13 shows a third example. In this figure, like reference numerals are used to denote corresponding parts to those in FIG. 11 and descriptions thereof are omitted. As shown in FIG. 13, the outer lead terminals 15b are aligned with the contact lands of the printed circuit board 23 and then attached to them by means of reflow soldering. In this state, the screws 28 inserted into the printed circuit board 23 are turned into the radiating fin 26, thereby securing the radiating fin to the printed circuit board 23. Grease 27 is applied between the module 24 and the radiating fin 26.

At the time of reflow soldering, the module itself is heated up to close to the melting temperature of solder 29. For this reason, it is required that the melting temperature of solder used within the module be higher than that of the solder 29 used for reflow soldering.

A fourth example will be described next, which remains almost unchanged from the third example shown in FIG. 13. In this example, the radiating fin 26 is also joined to the semiconductor module 24 with solder. That is, the radiating fin 26 as well as the module 24 is joined to the printed circuit board 23 by means of soldering. In soldering, the module 24 and the radiating fin 26 are aligned with each other using a jig. The solder used for joining the printed circuit board 23 and the module 24 together and the solder used for joining the module 24 and the radiating fin 26 together have an equal melting temperature, which should be lower than that of the solder used inside the module 24.

According to the first to fourth examples, the semiconductor module 24 is mounted on the printed circuit board 23 through the stress relaxing portions 15d of the outer lead terminals 15b. For this reason, when the semiconductor module has warped, the stress imposed on the module 24 can be reduced by the stress relaxing portion 15d. Therefore, imperfect contact between the outer lead terminals 15b and the printed circuit board 23 can be avoided and high current can be handled. Moreover, stress in any direction can be relaxed by using the outer lead terminals 15c of FIG. 9B which have the stress relaxation portion 15d in its upper portion which is twisted by 90 degrees relative to the lower portion and setting the stress relaxation portion to conform to the direction of stress to be relaxed.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A power semiconductor module comprising:
   a circuit board having an insulating substrate and first and second interconnect patterns formed on the insulating substrate, the first and second interconnect patterns being separated from each other;
   a power semiconductor chip mounted on the first interconnect pattern without ranging over the second interconnect pattern;
   bonding wire for electrically connecting the semiconductor chip and the second interconnect pattern;
   outer lead terminals fixed to each of the first and second interconnect patterns; and
   a resin layer for covering at least the chip mounted surface of the circuit board in its entirety so that the tip of each of the outer lead terminals is exposed.

2. A power semiconductor module comprising:
   a circuit board having an insulating substrate and first and second interconnect patterns formed on the insulating substrate, the first and second interconnect patterns being separated from each other;
   a power semiconductor chip mounted on the first interconnect pattern without ranging over the second interconnect pattern;
   bonding wire for electrically connecting the semiconductor chip and the second interconnect pattern;
   outer lead terminals fixed to each of the first and second interconnect patterns; and
   a resin layer for covering at least each of the semiconductor chips mounted on the circuit board so that the tip of each of the outer lead terminals is exposed.

3. The power semiconductor module according to claim 1, wherein the insulating substrate is made of a ceramic, each of the first and second interconnect patterns consists of sheet copper, and the first and second interconnect patterns are formed on the chip mounted surface of the circuit board.

4. The power semiconductor module according to claim 2, wherein the insulating substrate is made of a ceramic, each of the first and second interconnect patterns consists of sheet copper, and the first and second interconnect patterns are formed on the chip mounted surface of the circuit board.

5. The power semiconductor module according to claim 1, wherein the outer lead terminals are cylindrical or prismatic in shape and connected at their tips with an external circuit by means of one of soldering, pressure contact, wire bonding, and welding.

6. The power semiconductor module according to claim 2, wherein the outer lead terminals are cylindrical or prismatic in shape and connected at their tips with an external circuit by means of one of soldering, pressure contact, wire bonding, and welding.

7. The power semiconductor module according to claim 1, wherein the outer lead terminals are each formed in the shape of a pin and connected with an external circuit by means of one of soldering and connectors.

8. The power semiconductor module according to claim 2, wherein the outer lead terminals are each formed in the shape of a pin and connected with an external circuit by means of one of soldering and connectors.

9. The power semiconductor module according to claim 1, further comprising a copper sheet attached to the opposite surface of the insulating substrate to the chip mounted surface.

10. The power semiconductor module according to claim 2, further comprising a copper sheet attached to the opposite surface of the insulating substrate to the chip mounted surface.

11. The power semiconductor module according to claim 1, wherein the resin layer consists of one of epoxy and silicone resins of low stress.

12. The power semiconductor module according to claim 2, wherein the resin layer consists of one of epoxy and silicone resins of low stress.

13. The power semiconductor module according to claim 1, further comprising a resin case for covering at least the top edges and sides of the resin layer, the resin case allowing the opposite surface of the circuit board to the chip mounted surface to be attached a radiation plate with pressure.

14. The power semiconductor module according to claim 2, further comprising a resin case for covering at least the top edges and sides of the resin layer, the resin case allowing the opposite surface of the circuit board to the chip mounted surface to be attached a radiation plate with pressure.

15. The power semiconductor module according to claim 14, wherein the resin case is fixed to the circuit board with adhesive and is filled with one of epoxy and silicone resins of low stress.

16. The power semiconductor module according to claim 1, further comprising locks provided on the sides of the resin layer for holding a part placed on the opposite surface of the circuit board to the chip mounted surface.

17. The power semiconductor module according to claim 2, further comprising locks provided on the sides of the resin layer for holding a part placed on the opposite surface of the circuit board to the chip mounted surface.

18. The power semiconductor module according to claim 1, further comprising locks provided on the sides of the circuit board for holding a part placed on the opposite surface of the circuit board to the chip mounted surface.

19. The power semiconductor module according to claim 2, further comprising locks provided on the sides of the circuit board for holding a part placed on the opposite surface of the circuit board to the chip mounted surface.

20. The power semiconductor module according to claim 13, further comprising locks provided on the resin case for holding a part placed on the opposite surface of the circuit board to the chip mounted surface.

21. The power semiconductor module according to claim 14, further comprising locks provided on the resin case for holding a part placed on the opposite surface of the circuit board to the chip mounted surface.

22. The power semiconductor module according to claim 1, wherein the circuit board is made of a material which has been warped beforehand in a direction to cancel out a warp caused by the resin layer.

23. A power semiconductor module comprising:
  a circuit board having an insulating substrate and interconnect patterns formed on the insulating substrate;
  a plurality of power semiconductor chips mounted on the circuit board, the semiconductor chips being electrically connected to the interconnect patterns;
  outer lead terminals having their lower ends fixed to the interconnect patterns and formed with elastic stress relaxing portions in their upper portions; and
  a resin layer for covering at least the chip mounted surface of the circuit board so that at least a part of each of the stress relaxing portions of the outer lead terminals is exposed, the stress relaxing portions relaxing stress acting on the semiconductor module.

24. The power semiconductor module according to claim 23, wherein the outer lead terminals have a planar structure and make plane contact at their lower ends with the interconnect patterns.

25. The power semiconductor module according to claim 23, wherein the stress relaxing portions of the outer lead terminals are set so that their stress relaxing direction is parallel to the direction of the longer edge of the circuit board.

26. The power semiconductor module according to claim 23, wherein the stress relaxing portions of the outer lead terminals are each substantially formed into the shape of the letter S.

27. The power semiconductor module according to claim 25, wherein the stress relaxing portions of the outer lead terminals are each substantially formed into the shape of the letter S.

28. The power semiconductor module according to claim 23, wherein the stress relaxing portions of the outer lead terminals are substantially formed into the shape of the letter S and twisted relative to their lower portions.

29. The power semiconductor module according to claim 25, wherein the stress relaxing portions of the outer lead terminals are substantially formed into the shape of the letter S and twisted relative to their lower portions.

30. The power semiconductor module according to claim 23, wherein the outer lead terminals are each formed into the shape of a coiled spring.

31. The power semiconductor module according to claim 25, wherein the outer lead terminals are each formed into the shape of a coiled spring.

32. The power semiconductor module according to claim 23, wherein each of the outer lead terminals is provided in its part with a disc spring.

33. The power semiconductor module according to claim 25, wherein each of the outer lead terminals is provided in its part with a disc spring.

34. The power semiconductor module according to claim 23, wherein the resin layer has elasticity and a part of each of the stress relaxing portions is positioned inside the resin layer.

35. The power semiconductor module according to claim 25, wherein the resin layer has elasticity and a part of each of the stress relaxing portions is positioned inside the resin layer.

36. The power semiconductor module according to claim 23, further comprising a radiator secured to the opposite surface of the circuit board to the chip mounted surface, the radiator being fixed to a printed circuit board with screws so that the stress relaxing portions of the outer lead terminals are brought into contact with interconnects of the printed circuit board.

37. The power semiconductor module according to claim 34, wherein the outer lead terminals are connected to the interconnect patterns by means of one of soldering, pressure contact, and welding, and the stress relaxing portions are connected to the interconnects of the printed circuit board by means of one of soldering and pressure contact.

38. The power semiconductor module according to claim 35, wherein the outer lead terminals are connected to the interconnect patterns by means of one of soldering, pressure contact, and welding, and the stress relaxing portions are connected to the interconnects of the printed circuit board by means of one of soldering and pressure contact.

* * * * *